United States Patent [19]

Bernstein

[11] Patent Number: 4,577,292

[45] Date of Patent: Mar. 18, 1986

[54] SUPPORT CIRCUITRY FOR MULTI-PORT SYSTEMS

[75] Inventor: Kerry Bernstein, South Burlington, Vt.

[73] Assignee: International Business Machines Corporation, Armonk, N.Y.

[21] Appl. No.: 499,729

[22] Filed: May 31, 1983

[51] Int. Cl.[4] .............................................. G11C 13/00
[52] U.S. Cl. ................................... 365/189; 365/230; 364/900
[58] Field of Search ..................... 365/189, 190, 230; 364/900

[56] References Cited

U.S. PATENT DOCUMENTS

| | | | |
|---|---|---|---|
| 3,801,965 | 4/1974 | Keller et al. ................... | 340/173 R |
| 3,896,417 | 7/1975 | Beecham ......................... | 340/172.5 |
| 4,078,261 | 3/1978 | Millhollan et al. .............. | 365/189 |
| 4,090,258 | 5/1978 | Cricchi .......................... | 365/184 |
| 4,183,095 | 1/1980 | Ward ............................. | 365/189 |
| 4,314,164 | 2/1982 | Tin et al. ....................... | 307/243 |

Primary Examiner—Terrell W. Fears
Attorney, Agent, or Firm—Francis J. Thornton

[57] ABSTRACT

The present invention is especially directed towards an improved support circuitry for a memory array which utilizes support circuitry in a memory array such that, when an address compare occurs, selected one of the array word decoders are disabled to prevent a multiple read, and selected higher order read heads are disabled and the output data of the highest order bit lines is transferred onto all of the lower order bit lines having the same address as the uninhibited word decoder.

6 Claims, 7 Drawing Figures

SUPPORT CIRCUITRY FOR MULTI-PORT SYSTEMS

FIELD OF THE INVENTION

This invention relates to a random access read/write memory system and, more particularly, to a multiple read/write system having improved support circuitry for reading such a system.

BACKGROUND OF THE INVENTION

In selected micro-processors, some of which require high speed registers as local storage, it would be desirable if each register can be separately addressable from a multiplicity of data-in ports for a write and separately addressable to a multiplicity of data-out ports for a read. The data, in the register, thus would be addressable at any data-in port and readable at any data-out port. Such multi-port devices might comprise, for example, three bit memory configurations, arranged with independent read and write addressing, so that upon a write, the identical information is written into each configuration, in the identical address position, and then sequential writes will write into the different port addresses, in parallel, so that each of the three configurations contain the same information in the same address positions, then a simultaneous read of the three configurations in three different positions—three different addresses—will present three different words to each of the three different out ports. When an attempt is made to merge the information and read it from a single configuration, problems arise. One such problem, with such arrangements, is that there is no restriction which prohibits all three read heads from trying to read data from the same cell at the same time. Since some of the cells must be significantly larger because of the simultaneous read, the cell size and the array size is double or triple; thus, such multi-port circuits have generally been avoided, for until recently, there has been no satisfactory way of preventing multiple reads in a single cell while delivering that cell data to each port with a multiple read.

RELATED INVENTIONS

Co-pending application by Anatol Furman, entitled "Multi-Port Register Implementations" filed Mar. 10, 1983, and assigned to the same assignee as the present invention discloses a basic multi-port system.

BACKGROUND ART

In U.S. Pat. No. 3,896,417 to D. Beecham, there is disclosed an arrangement whereby a plurality of shift registers is arranged together with a comparator to compare the rotational positions of an input write ring counter and an input read ring counter so that when a matched signal is developed, the write counter is disabled.

In U.S. Pat. No. 4,183,095 to W. P. Ward, there is described a high density memory system that uses serially reading and writing data from and into selected memory elements by using a comparator to control the operating mode of the memory system. Thus, the read and write mode is selected by comparing the signal on a clock conductor.

Finally, in M. S. Millhollan et al, U.S. Pat. 4,078,261, there is described a system in which read circuitry is disabled during a write cycle.

SUMMARY OF THE INVENTION

The present invention is especially directed towards an improved support circuitry for a memory array which utilizes support circuitry in a memory array such that, when an address compare occurs, selected ones of the array word decoders are disabled to prevent a multiple read, and selected higher order read heads are disabled and the output data of the highest order bit lines is transferred onto all of the lower order bit lines having the same address as the uninhibited word decoder.

From the foregoing, it can be seen that one object of the present invention is to provide an improved support circuitry for reading multi-port memory systems.

Another object of the present invention is to provide an inhibit and transfer circuit for multi-port memory systems which is extendable to any size system and which results in better power performance as well as a smaller size.

These and other objects of the present invention will become more apparent when taken in conjunction with the following descriptions and drawings wherein there is set forth a specific embodiment of the present invention.

BRIEF DESCRIPTION OF THE DRAWINGS

FIG. 2 comprised of FIGS. 2A and 2B, illustrates the array of FIG. 1 with typical detailed circuits for the word decoders and one of the cells of the array.

DESCRIPTION OF THE PREFERRED EMBODIMENT

A multi-port register stack is intrinsic to selected micro-processors, some of which require 16 high speed registers as local storage. Each register is required to be at least 32 bit long, (any may be even longer if parity is required), for the 32 bit processor. Thus, it is convenient to consider the register stack as a 512 bit static memory with 16 words of 32 bits each; where every read or write is a 32 bit wide word.

The term "multi-port" as used herein refers to the requirement that each register must be separately addressable from a multiplicity of data-in ports (for a write), or each register must be separately addressable to a multiplicity of data-out ports (for a read). The term "port" refers to the number of ways that a given register (or bit in a register) may be addressed; but (addressable) from any port.

To more clearly demonstrate the action of a multi-port register stack, consider the following implementation of a multi-port register stack which requires three reads. Three single port 512 bit memories with independent read and write addressing are arranged so that on a write, the identical information is written into each memory in the identical addressed position. Then, sequential writes will write the same information into each memory into the different port addresses in parallel, so that each of the three memories contains the same information in the same address positions. Finally, a simultaneous read of the three memories in three different addresses will present three different words to each of the three different output ports.

Figure 1:
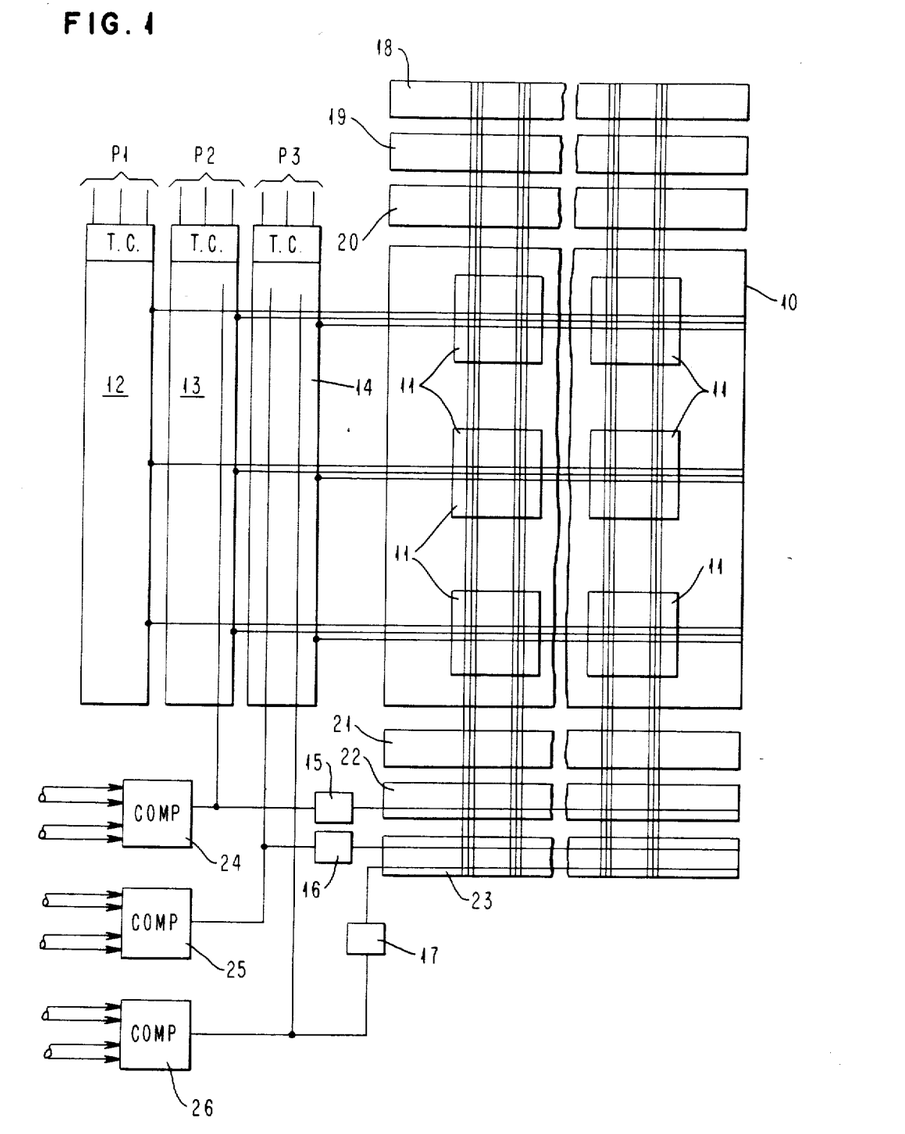
FIG. 1 illustrates in block schematic form a complete array of the system employing the present invention.

The present implementation is especially exemplified in FIGS. 1 and 2. Referring now to FIG. 1 of the drawing, there is shown a block diagram of a multi-port memory system employing the present invention.

The system has an array 10 of storage cells 11, each cell of which is coupled to a set of word lines and a set of differential bit lines. Each set of word lines and each set of differential bit lines is equal in number to the number of ports in the system. For purposes of example only, a three-port system will be described. In this case, each cell is coupled to three word lines, and six bit lines, i.e., three pairs of differential bit lines arranged orthogonal to the word lines. The word lines are coupled to the three respective sets of word decoders 12, 13 and 14 driven by respective sets of input address lines P1, P2 and P3. Thus, FIG. 1 shows unit cells 11 (each one bit) of a three port (three read and three write ports). If the cell 11 is replicated 32 times horizontally, (only two are shown in the figure) it represents one word of the register stack. Replicated 16 times vertically, (only three are shown in the figure) it represents one bit of the register stack.

As shown in FIG. 2, transistors 30, 31, 32 and 33 constitute the memory cell or latch, while transistors 34 and 35 differentially couple the bit lines 40 and 41 to the cell for reads and writes. This is basically the well known, classic six device cell.

Transistors 36, 37, 38 and 39 constitute the bit line coupling for the additional two ports, i.e., the additional two pairs of bit lines. Each cell is selected by one of three word lines 46, 47, 48 and read from or written into by its corresponding bit line pair. Two other cells in two other register words aligned vertically under this cell are also selected by their word lines, and read or written onto their respective bit line pairs from their respective ports.

Until very recently there was no restriction to prohibit all three ports from trying to read data from the same cell at the same time. To sink all of the current that the bit line coupling devices can deliver without changing state, transistors 30 and 31 must be large. That is, they must not permit data to be lost on a multiple read disturb. If three simultaneous reads are permitted in the same cell, then transistors 30 and 31 need be three times as large as if only one read is permitted to occur in that cell, but increasing their size three-fold represents a doubling of the cell size, and thus the array size.

The present invention corrects all these problems and comprises adding circuits to inhibit the address decoders while simultaneously transferring data from the lower order selected bit lines onto the other higher order selected bit lines and thence into the output ports of other read heads. In this implementation, the additional circuitry permits faster performance.

The bit lines are coupled to suitable write heads 18, 19 and 20 and to three read heads 21, 22 and 23 of which read heads 22 and 23 also contain inhibit and transfer circuits. Those heads 22 and 23 which contain inhibit and transfer circuits are referred to as higher order circuits, with head 23 being a higher order than head 22, which, in turn, is a higher order than head 21. Similarly, these write decoders coupled to the comparator circuits 24, 25 and 26 are referred to as higher order circuits; with decoder 14 being of a higher order than decoder 13, which is, in turn, of a higher order than decoder 12. There is also provided in accordance with the present invention three comparator circuits 24, 25 and 26, each of which are coupled to selective sets of the word decoder input address lines, to one or another of the high order word decoders 13 and 14, and to one or the other of the high order read heads 22 and 23, for comparing the address inputs to the word decoders, and, in the event of a compare, altering the output of the selected higher order word decoders to source it to conform to the selected order read heads having the same address. In this way, the output data from the cell is transmitted via all addressed output read heads without increasing the current flow through the cell.

Figure 2A:
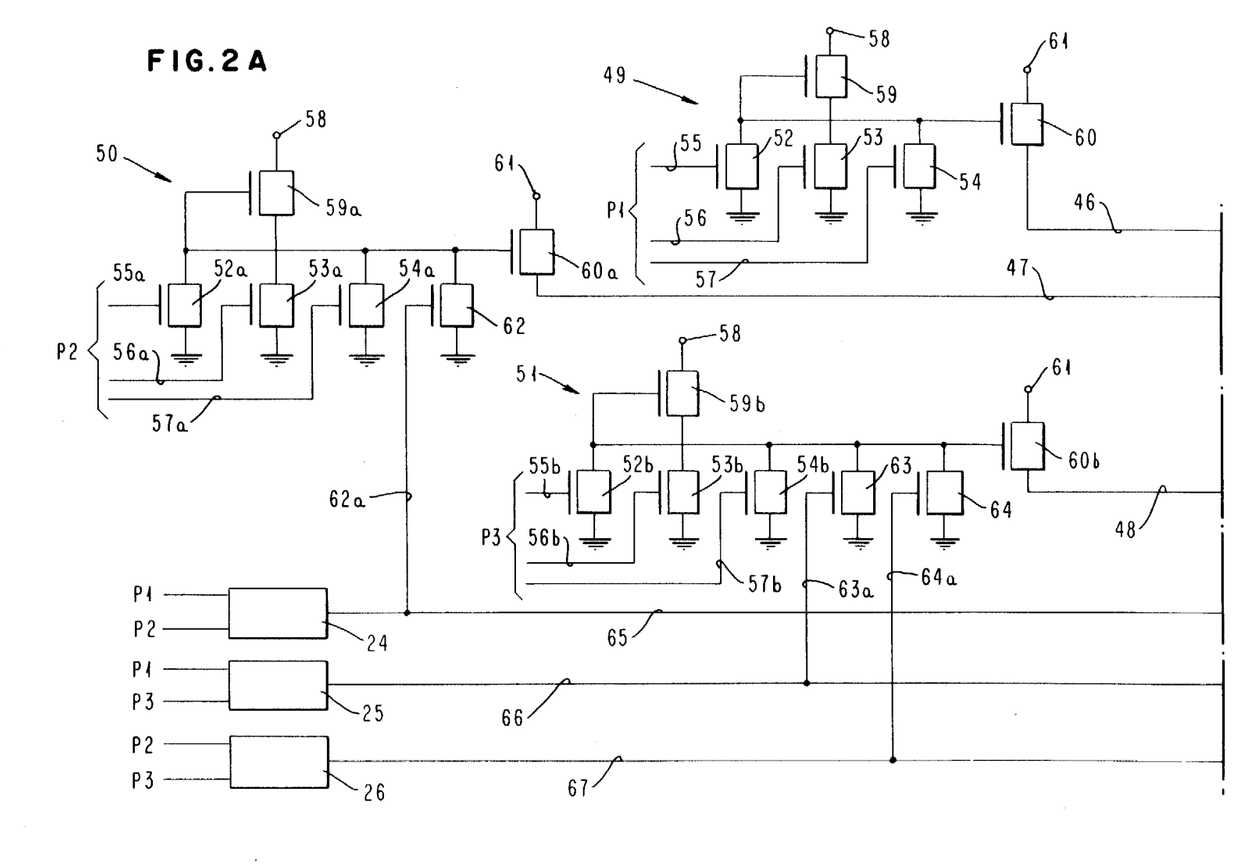
Figure 2B:
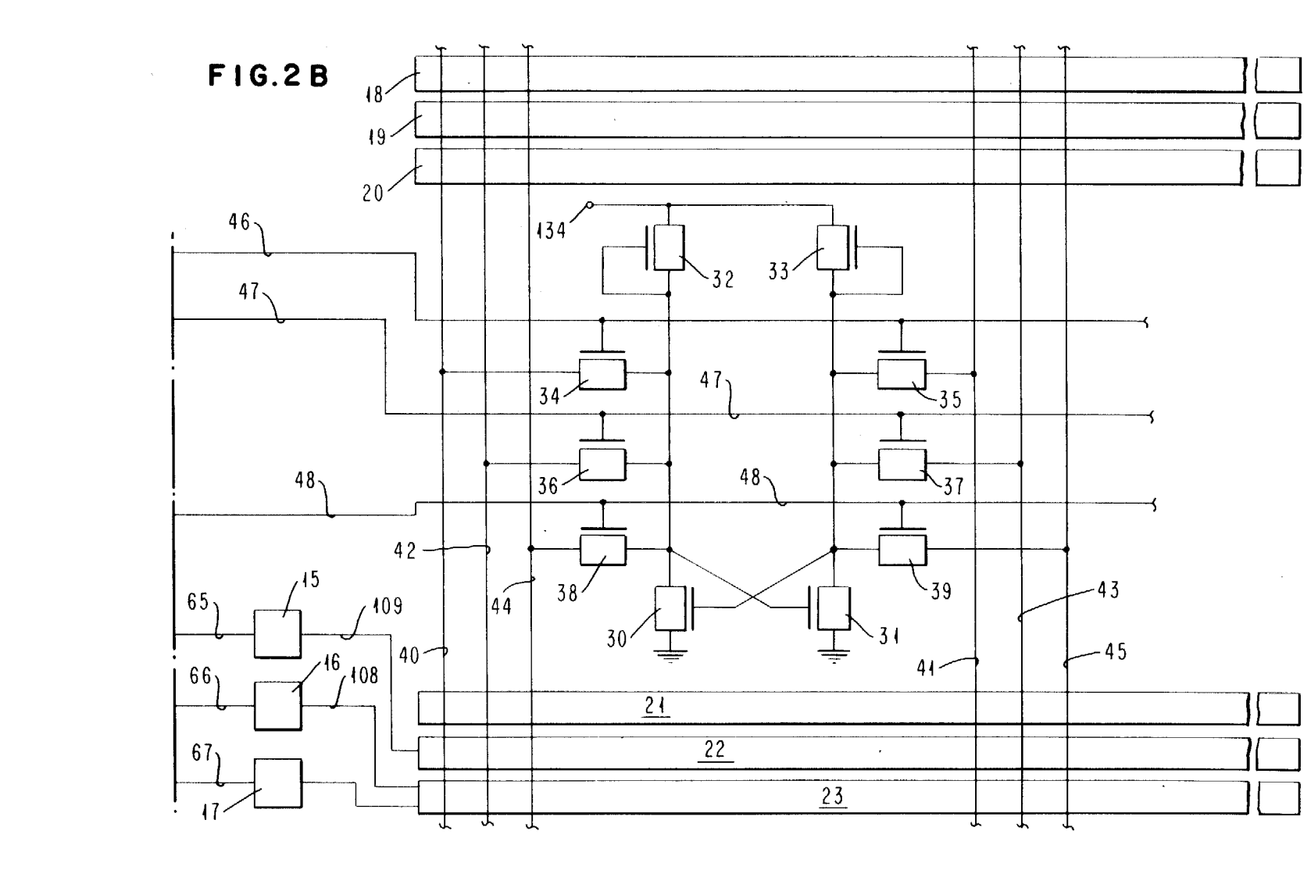

FIG. 2 illustrates in greater detail one of the cells 11 and its associated word decoders and for convenience is shown in two parts, FIG. 2a and FIG. 2b.

The cell 11 comprises a pair of cross coupled transistors 30 and 31 having their sources coupled to ground and their drains coupled through respective transistor loads 32 and 33 to a voltage source 134. The drains of the transistors 30 and 31 are also coupled through respective bit line transistors to respective bit lines. Thus, the drain of transistor 30 is coupled through bit line transistors 34, 36 and 38 to respective bit lines 40, 42 and 44 while the drain of transistor 31 is connected through bit line transistors 35, 37 and 39 to respective bit lines 41, 43 and 45.

The operation of such cross coupled cells is well known to the art and need not be described here. However, the operation of the cell basically depends upon the state of the transistors of 30 and 31 such that a differential signal is set up on the bit line pairs attached to the particular cell. Thus, for example, if the transistor 30 is off and the transistor 31 is turned on then the active bit lines coupled to the transistor 30 would be high and the active bit lines coupled to the transistor 31 would be pulled low, thus setting up a differential voltage on each of the three pair of bit lines 40, 41; 42, 43; and 44, 45 which may be coupled to the cell through an active bit line transistor. The differential voltage on the selected bit lines can be read, at any time after a write, by suitable read heads 21, 22 and 23. This system, therefore, uses a time-multiplex read and write. This is, the read and write operations are sequential and not simultaneous.

It, of course, should be understood that although the described embodiment is so limited the invention is not so limited and can be applied to simultaneous read/write operations.

The gates of the bit line transistors are connected in pairs 34, 35; 36, 37; and 38, 39; to respective word lines 46, 47 and 48. Thus, the gates of transistors 34 and 35 are connected to word line 46. The gates of bit line transistors 36 and 37 are connected to the word line 47 and the gates of bit line transistors 38 and 39 are connected to the word line 48.

These word lines are in turn coupled to a respective one of the selected word decoders 49, 50 and 51. These word line decoders are, of course, just one of each of the sets of word decoders contained in the word decoders 12, 13 and 14 respectively. Each word decoder is basically comprised of a plurality of input decode transistors, each of which has its gate coupled to a respective address line. In this case it will be presumed, for purposes of explanation only, that three addresses are employed. Thus, decoder 49 comprises of three input decode transistors 52, 53 and 54 having their gates coupled to respective address lines 55, 56 and 57 which will be collectively referred to as address P1. The sources of the input transistors 52, 53 and 54 are coupled to ground and their drains are coupled to a voltage source 58, through a load 59, and are also coupled to the gate of a switching transistor 60 whose drain is coupled to a voltage source 61 and whose source is coupled to the word line 46.

Of course, it should be understood that if more than three addresses are required or used in the system, then additional input decode transistors equal to the number of input address lines would be used in such decoders.

Such word decoders generally operate as follows. If any one or all of the address lines 55, 56 and 57 has a positive signal thereon, say address line 55 is high, the device 52 is on causing the gate of device 60 to be grounded. Thus, the device 60 is off and the address line 46 is off. When all of the input addresses, lines 55, 56 and 57 are negative then the device 60 is on and the word line 46 is high since it is now coupled through device 60 to the voltage source 61. When the word line 46 is high the bit line devices 34 and 35 are on and information in the cell, i.e., the state of the cross coupled devices 31 and 32 is differentially received by the bit line pair 40 and 41 which are now coupled to the cell through the bit line devices 34 and 35.

The other decoders 50 and 51 are substantially identical to the decoder 49 and operate in identical fashion except that decoder 50 has one additional device 62 in parallel with the address decode devices 52a, 53a and 54a and decoder 51 has two additional devices 63 and 64 which are in parallel with the input address decode devices 52b, 53b and 54b. The gate of the additional device 62, in decoder 50, is coupled to the output of the first comparator circuit 24 while the gate of the first additional device 63, in decoder 51, is coupled to the output of the second comparator circuit 25 and the gate of the second additional device 64, in decoder 51, is coupled to the output of the third comparator circuit 26.

For the sake of convenience, the input address lines 55, 56 and 57, to decoder 49, will collectively be referred to as address set P1. The input decode address lines 55a, 56a and 57a, to the decoder 50, will collectively be referred to as address set P2 and the input address lines 55b, 56b and 57b, to the decoder 51, will be collectively referred to as address set P3.

These address lines, in addition to being coupled to respective decoders, are also coupled to respective ones of the comparator circuits 24, 25 and 26. Thus, for example, comparator circuit 24 has the address sets P1 and P2 introduced thereto while comparator 25 has the address sets P1 and P3 introduced thereto and comparator 26 has the address sets of P2 and P3 introduced thereto.

In these comparator circuits the address sets are compared and, if a comparison is found, a suitable and positive output signal is transmitted from the comparator. For example, a comparison between address sets P1 and P2 causes a positive signal to be presented on line 65 and transmitted from comparator 24 to the gate of the additional device in the decoder; in this case, device 62 in decoder 50, via line 62a. This positive signal causes device 62 to turn on and to deactivate the word line 47. This effectively disables the decoder 50 and prevents it from acting on input address set P2. Similarly, if a comparison appears between address sets P1 and P3, then a signal appears on lines 66 and 63a and device 63 in decoder 51 is turned on and the word line 48 is deactivated. Again, if the address sets P2 and P3 have a comparison a signal appears on lines 67 and 64a and device 64, also in decoder 51, is turned on, again the word line 48 would be deactivated. In this case, positive signs from either comparator 25 or 26 will effectively disable decoder 51.

Simultaneously, the output of the comparator circuits is transmitted to the higher order read heads, 22 and 23, via clocked buffer circuits 15, 16, and 17 to selectively alter one or both of these higher order read heads 22 and 23. For example, if only addresses P1 and P2 compare, then only the higher order read head 22 is altered and read heads 21 and 23 are unaffected. Similarly, if only addresses P2 and P3 compare, then only the higher order read head 23 is altered and read heads 21 and 22 are both unaffected. Finally, if all these addresses compare, both read heads 22 and 23 are altered and only a single read head, i.e., head 21 is unaffected. Of course, it must be clearly understood that different addresses are directed to and activate different cells and that the only time a problem arises is when the cell is being addressed by two or more identical addresses.

Thus, the higher order read heads are prevented from trying to read data through the cell at the same time and devices 30 and 31 of cell 11 need not be enlarged since the current through the cell will not be excessive.

Figure 3:
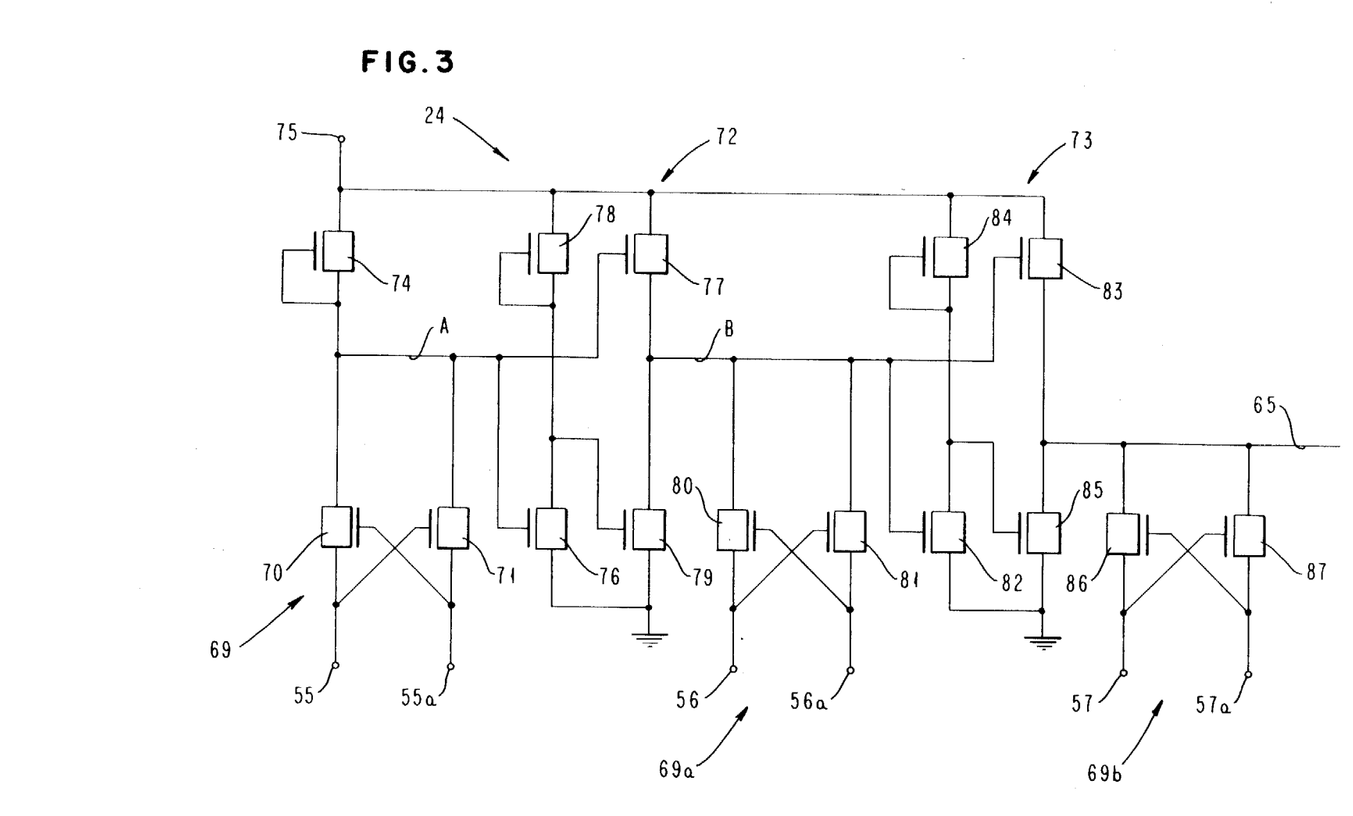
FIG. 3 illustrates the preferred embodiment of the comparator circuit of the invention as would be used in FIG. 1.

Turning now to FIG. 3, comparator circuit 24 will be described in greater detail as to its construction and operation.

FIG. 3 shows in detail the circuitry comprising the comparator circuit 24 of FIGS. 1 and 2. Basically, this comparator circuit 24 uses three serially arranged exclusive-ORs 69, 69a and 69b, alternated with common inverters 72 and 73 and with the final OR circuit 69b of the chain feeding line 65. The compares are implemented in low power logic preferably at the instruction address register where the addresses are stored. The net result is that only one read in a cell is guaranteed and the cell transistors 30 and 31 may be reduced in size by a factor of three. The bit lines become shorter and the bit line parasitic capacitance significantly reduced such that the rise and fall times of the bit lines are correspondingly reduced.

As noted above the compare circuit 24 requires three exclusive-ORs 69, 69a and 69b, each of which does a bit-by-bit address compare. Thus address lines 55 of address set P1 and lines 55a of address set P2 feed into the first exclusive-OR circuit 69 via the sources of cross coupled transistors 70 and 71 whose drains are coupled together at node A. This node A is coupled through a load transistor 74, to a voltage source 75 and to the gates of inverter transistors 76 and 77 of an inverter circuit 72 which also includes a load transistor 78 and a follower transistor 79. The source of transistor 76 is grounded and its drain is coupled through a second load transistor 78 to the voltage source 75. The drain of transistor 76 is also coupled to the gate of the follower transistor 79. The drain of transistor 79 is grounded and its source is connected through transistor 77 to voltage source 75 and to node B.

The following exclusive-OR circuit 69a is, as shown in FIG. 3, substantially the same as circuit 69 except that different address lines 56, 56a are coupled into the sources of the cross coupled transistors 80 and 81 of this exclusive-OR. These transistors 80 and 81 have their drains coupled together at node B and from there to the following inverter circuit 73 whose output is coupled to the third and final exclusive-OR circuit 69b. Node B is coupled to the gates of transistors 82 and 83 with the source of transistor 83 grounded and its drain coupled through a load transistor 84 and to the gate of source follower transistor 85 whose drain is grounded and whose source is coupled through transistor 83 to the voltage source 83 and to the output line 65. This final exclusive-OR circuit 69b comprises a pair of cross coupled transistors 86 and 87 whose sources are coupled to address lines 57 and 57a respectively and whose drains are coupled to the output line 65. Circuit 69a is substantially identical to circuit 69 except that the input address lines are address lines 56 and 56a respectively. Similarly, circuit 69b is also identical to circuits 69 and 69a except that its input lines are address lines 57 and 57a respectively. In this way, an address by address comparison is made between the P1 address inputs and the P2 address inputs. This comparator circuit performs the module ripple method when comparing two addresses of equal length. There is no clocking required since the circuit is fully static.

The following examples illustrate the operation of the circuit. We will first assume a first address set P2 comprising signals on lines 55, 56, 57 and a second address comprising signals on lines 55a, 56a and 57a are present and further assume that all signals are equal except for the signals on lines 56 and 56a, i.e., these signals differ from one another. In this case because the signals on lines 55 and 55a are equal transistors 70 and 71 remain off and the node A remains high due to the load transistor 74 and transistors 76 and 77 are conductive. With transistors 76 and 77 conductive transistor 79 is held off and its source tries to go high because transistor 77 is conductive. However, because the signals on lines 56 and 56a are different one of the cross coupled transistors 80 or 81 turns on pulling down the node B and holding the gates of transistors 82 and 83 low so that these devices remain off. With device 82 off the gate of device 85, due to load transistor 84, turns on pulling down line 65. With line 65 down no inhibiting and transfer signal is sent to the read head 22 via the clocked buffer circuit 15 and it operates in its normal manner.

In the event of a compare between address sets P1 and P2, i.e., when all the signals on lines 55, 55a, 56, 56a, 57, and 57a are identical, the circuit operates as follows. Because of the equal signals on lines 55 and 55a applied to the gates of transistors 70 and 71 they both remain off and the node A remains high due to the load transistor 82 causing transistors 76 and 77 to be conductive. With transistor 76 conductive transistor 79 is held off and node A goes high because transistor 77 is conductive. In this case the signals on lines 56 and 56a are identical and neither one of the cross coupled transistors 80 or 81 turn on and the node B remains high holding the gates of transistors 82 and 83 high so that these devices turn on holding device 85 off permitting line 65 to rise due to the action of the transistor 83. Line 65 remains high because transistors 86 and 87 also remain off due to the identity of two signals appearing on lines 57 and 57a. With line 65 high an inhibiting and transfer signal is applied via buffer circuit 15, to an inhibit and transfer circuit coupled to read head 22.

When the line 65 leading from the ripple comparator circuit is high indicating a compare the read head 22 is altered as will be described in conjunction with FIG. 4 and also the address decoder 50 is deactivated.

Comparator 25 is similarly arranged except that it compares the address set P1, introduced into address decoder 49, with the address set P3, introduced in address decoder 51, and its output line 66 feeds, via the buffer circuit 16, an inhibit and transfer circuit associated with the read head 23, and also feeds line 63a leading to device 63 in the word decoder 51.

Comparator circuit 26 is identical in construction to comparator circuits 24 and 25 except that it compares the address set P2, introduced to the word decoder 50, with these address set P3, introduced into the word decoder 51. Its output line 67 also feeds a second inhibit and transfer circuit associated with read head 23 and the inhibit line 64a leading to device 64 in the word decoder 51. A positive signal on either line 66 or 67 will cause a signal to be sent to the read head 23 and the word line decoder 51.

Figure 4:
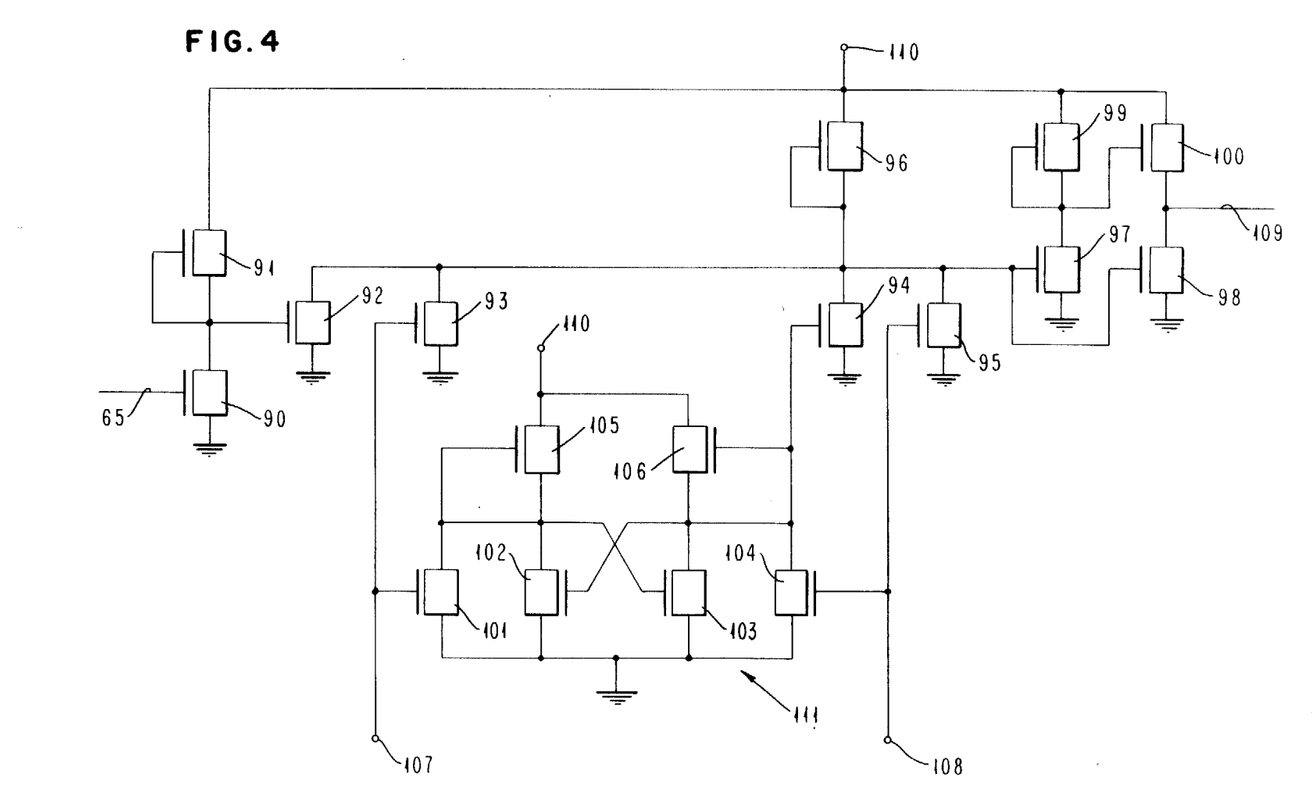
FIG. 4 illustrates a clock buffer circuit useful in the present invention.

Turning now to FIG. 4 the clocked buffer circuits 15, 16, and 17 will be described in detail. Since each of these clocked buffer circuits are identical one to the other only one circuit, namely circuit 15 will be shown in detail.

These circuits clock and decode the signal from the compare circuits to which they are coupled to assure that the inhibit and transfer signals are being transmitted to the inhibit transfer circuits associated with the read heads 21, 22, and 23 function in the desired manner at the desired time.

This circuit 15 as shown in FIG. 4 receives a signal from a compare circuit 24 on line 65. This line 65 is coupled to the gate of transistor 90 whose source is grounded and whose drain is coupled to the gate of a first decode transistor 92 of a series of decode transistors 92, 93, 94, and 95 and through a load transistor 91 to a voltage source 110. The decode transistors 92, 93, 94, and 95 all have their sources grounded and their drains coupled together to the voltage source 110 through the load transistor 96 as well as to the gates of follower transistors 97 and 98. These follower transistors 97 and 98 have their sources grounded. The drain of transistor 97 is coupled through a load transistor 99 to source 110 and to the gate of a control transistor 100. The drain of transistor 98 is coupled to the output line 109 and to the voltage source 110 through the control transistor 100.

The gates of decode transistors 93 and 95 are respectively coupled to clocked input lines 107 and 108 while the gate of transistor 94 is coupled to the output of a clocked latch 111. This latch 111 is formed with a pair of cross coupled transistors 102 and 103 whose sources are now grounded and whose drains are connected through respective load transistors 105 and 106 to voltage source 110. In parallel to the cross coupled transistors 102 and 103 are a pair of switching transistors 101 and 104 whose sources are grounded and whose drains are coupled through the respective load transistors 105 and 106 to voltage source 110. The drains of transistors 103 and 104 are also coupled to the output line of the latch which is coupled to the gate of decode transistor 94. The gates of the two switching transistors 101 and 104 are coupled to the clock input lines 107 and 108 respectively.

This clocked buffer circuit works as follows. The output line 109 is normally high due to the fact that transistors 97 and 98 are normally off due to transistor 92 being normally on due to the effect of load transistor 91. The control transistor 100 is normally on, thus line 109 is substantially at the level of the voltage source 110. Assume that both clock lines 107 and 108 do not have a signal thereon. When a compare signal is received on line 65 transistor 90 is turned on causing the gate of transistor 92 to be pulled low and transistor 92 turns off. The gate of transistors 97 and 98 coupled to the drain of transistor 92 rises and transistors 97 and 98 turn on. When transistor 97 turns on it pulls down the gate of transistor 100 causing the voltage on line 109 to be cut off from the voltage source 110. Simultaneously as transistor 98 turns on it pulls the output line 109 towards ground. Once the compare signal, received at the input of device 90 which causes switching of device 92 disappears the circuit tries to revert to its normal state and the line 109 tries to rise.

Clock signals are applied sequentially to lines 107 and 108 to assure that line 109 remains in its set, i.e., normally high condition for a specified period of time regardless of the existence of a compare signal on line 65. By providing clock pulses to the circuit the output line 109 can be forced to remain in its set, normally high, low logic state for a predetermined period of time. This circuit uses negative logic. This is accomplished by applying spaced positive clock signals to the lines 107 and 108. If we assume clock line 107 rises first then it causes transistor 93 to turn on and pull down the gates of transistors 97 and 98. These gates remain grounded for the duration of the clock signal even if the compare input signal on line 65 terminates. Simultaneously the clock pulse on line 107 causes the transistor 101 to turn on pulling down the gate of cross coupled transistor 103 turning off transistor 103. When transistor 103 turns off the gate of transistor 102 rises turning on transistor 102 and latching the gate of transistor 103 low. When transistor 103 turns off the output of the latch 111 rises and transistor 94 turns on. The latch 111 now remains in this state after line 107 returns to a low state, and until a positive clock signal appears on line 108. When a suitable timing signal is applied to line 108 it causes transistors 95 and 104 to turn on. When transistor 104 turns on the gates of transistors 94 and 102 are pulled down turning transistors 94 and 102 off. When transistor 102 turns off the gate of transistor 103 turns on and continues to hold both the gate of transistor 102 and 94 low. When the timing pulse on line 108 terminates, the transistor 95 turns off. With transistors 93, 94 and 95 shut off, i.e. the latch is off and no clock pulses are on either lines 107 or 108, the line 109 is controlled solely by device 92, whose gate is driven by an inverted state of line 65.

Figure 5:
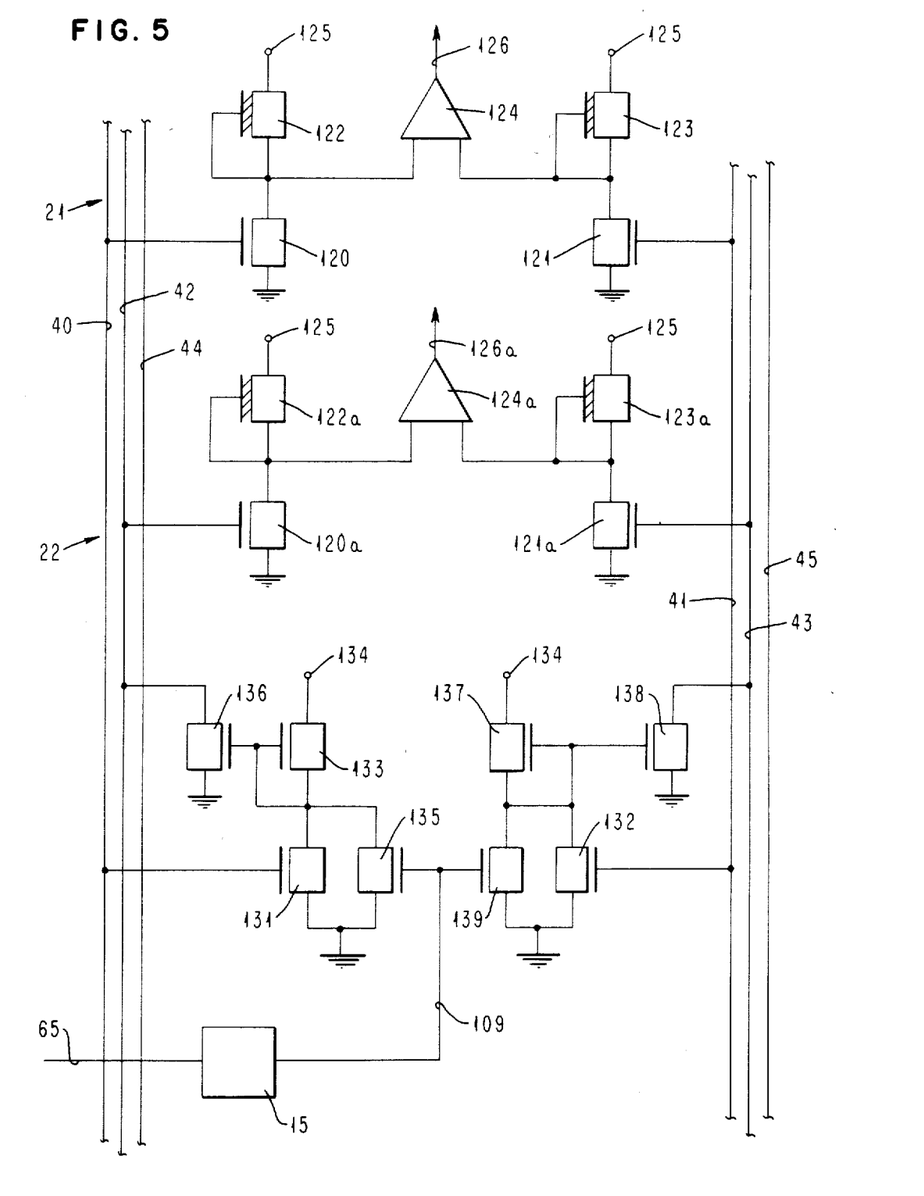
FIG. 5 illustrates the preferred embodiment of the read head 21 and of the read head 22 and its associated inhibit and transfer circuitry.
Figure 6:
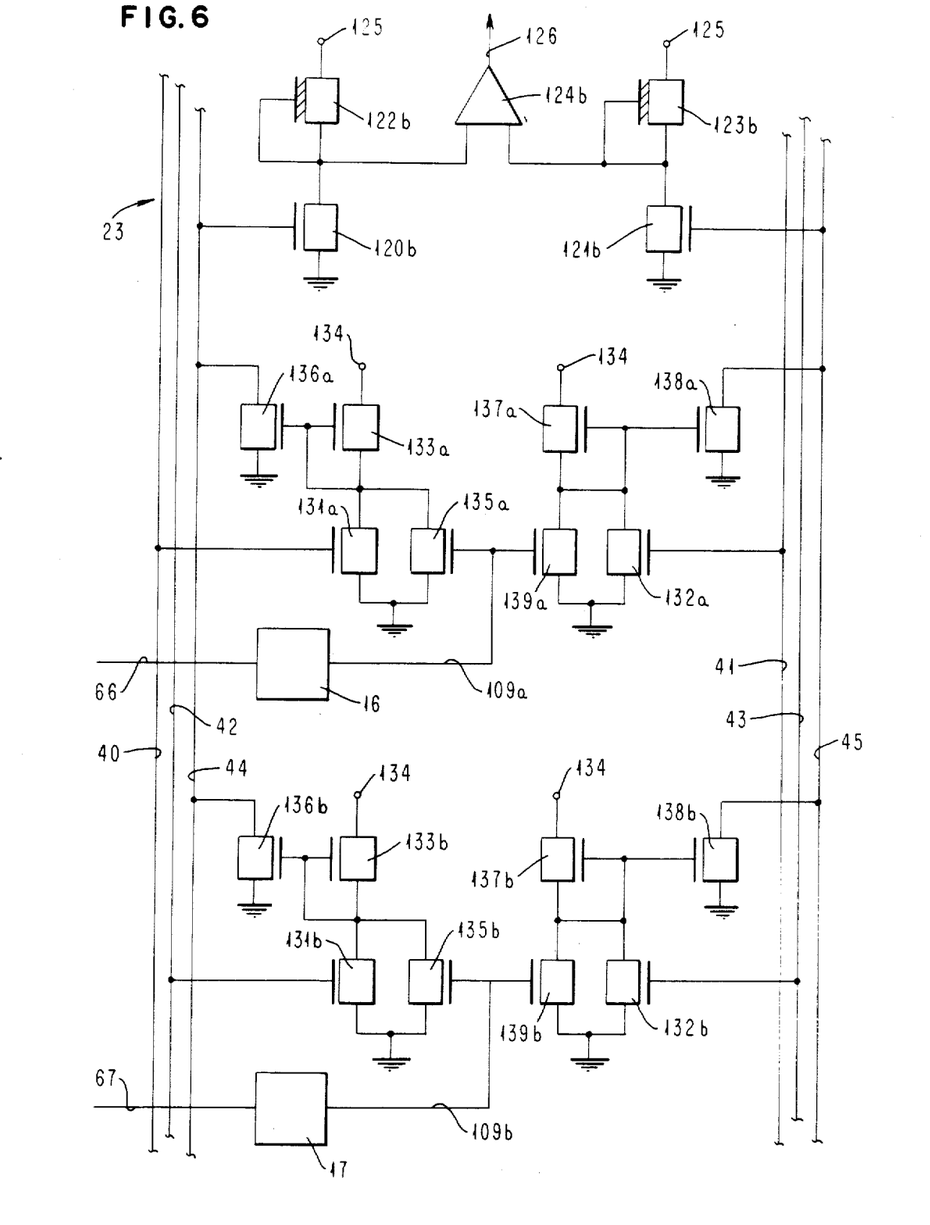
FIG. 6 illustrates the preferred embodiment of the read head 23 and its associated inhibit and transfer circuitry.

Turning now to FIGS. 5 and 6, the read heads 21, 22 and 23 and their associated inhibit and transfer circuits, suitable for use in the invention, will be described in detail.

Read head 21 comprises a pair of bit line read transistors 120 and 121 whose gates are coupled to differential bit lines 40 and 41 respectively. The sources of both transistors 120 and 121 is coupled through a load transistor 122 to a voltage source 125 while the drain of transistor 121 is coupled through another load transistor 123 to the voltage source 125. The drains of transistors 120 and 121 are both coupled to an output amplifier; in this example there is shown a differential amplifier 124. This amplifier 124 has a low impedance source and is generally referred to as a powering block. This differential amplifier 124 is well known to the art and need not be further described. Its output is coupled to an output read line 126 and is activated whenever bit line devices 34 and 35 are turned on, by activation of word line 46. As noted previously activation of these bit line devices causes the differential signal from the cell devices 30 and 31 to appear on the bit lines 40 and 41 respectively. This differential signal turns on one or the other read transistor 120 or 121 causing the amplifier 124 to emit a suitable signal. Thus, read head 21 is typical to those known to the prior art.

Read head 22 is similar, and has a set of read transistors 120a and 121a whose gates are coupled to the bit lines 42 and 43 respectively, their sources are connected to ground, and their drains to the voltage source 125 through the load transistors 122a and 123a respectively, and to the differential amplifier 124a. In addition, read head 22 is provided with an inhibit and transfer circuit.

The inhibit and transfer circuit shown in FIG. 5 coupled to read head 22 comprises a pair of bit line activated transistors 131 and 132 whose gates are coupled to the differential bit lines 40 and 41 respectfully. The sources of both these transistors 131 and 132 are coupled to ground. The drain of transistor 131 is coupled through a load transistor 133 to a voltage source 134, to the drain of a switching transistor 135, to the gate of the load transistor 133, and to the gate of a grounding transistor 136. This switching transistor 135 has its source coupled to ground. The grounding transistor 136 has its source connected to ground and its drain connected to bit line 42 of the bit line pair 42 and 43.

The bit line switching transistor 132 has its source connected to ground and its drain connected through a load transistor 137 to the voltage source 134 to the drain of a second switching transistor 139, and to the gate of a second grounding transistor 138 whose source is also coupled to ground and whose drain is coupled to the second bit line 43 of the differential bit line pair 42 and 43. The switching transistors 135 and 139 both have their drains coupled to ground and their sources coupled through the respective load transistors 133 and 137 to the voltage source 134. The gates of both the switching transistors 135 and 139 are coupled to the output line 109 of the clocked buffer circuit 15.

This inhibit and transfer circuit provides faster read and storage times thus accomplishing faster power cycling.

The circuit operates as follows. It will be assumed that all bit lines 40 to 45 are normally high and transistors 131, 132, 135 and 139 are on. It will also be assumed that address sets P1 and P2 have selected the bit line pairs 40 and 41, and 42 and 43 and are applying a differential signal thereto. The address set P1 causes the bit line 41 of the differential bit line pair 40 and 41, coupled to read head 21, to be pulled low thus providing a differential signal to the read head 21 causing it to provide an output signal on line 126. It will now be further be assumed that the address sets P1 and P2 are identical; thus the buffer circuit output line 109 has a negative signal thereon. This negative signal now causes devices 135 and 139 to turn off. However, because bit line 40 is high device 131 is held on holding the gate of transistor 136 low so that transistor 136 is off and bit line 42 remains high. Meanwhile bit line 41 is low and device 132 turns off. Thus, the drain of transistor 132 rises due to the load transistor 137 and device 138 turns on causing the bit line 43 to be pulled low. When this occurs the state of bit lines 42 and 43 conform to the bit lines 40 and 41, i.e., line 42 is high as is line 40 and line 41 is low as is line 43 that is the state of the low order bit line pairs 40 and 41 has been transferred to the higher order bit line pairs 42 and 43. This state of bit lines 42 and 43 is now read by the read head 22 coupled between bit lines 42 and 43. In this way the read heads 21 and 22 are made to provide identical outputs on lines 126 and 126a even though only one cell has been accessed.

If the read addresses P1 and P2 had been different the signal on line 109 would have remained high causing both transistors 135 and 139 to remain on holding the gates of both transistors 136 and 138 low. With these gates low both transistors 136 and 138 remain off and the bit lines 42 and 43 operate in their normal manner independently of the bit line pair 40 and 41 and the read head 22 would read the information on lines 42 and 43.

The above described technique has a number of unique advantages not realized by the prior art. By using the differential pairs in this manner at no time are both bit lines of the second pair grounded. This means that during restore, following reading of the bit lines 42 and 43, only bit line 43 would have to be restored. This cuts the capacitive restore load in half and reduces the restore time to one-half that known and used by the prior art. This also reduces the power to approximately half that needed by the prior art circuitry.

Moreover, this permits the transfer sensing load to be moved to the bit lines themselves rather than on a sense amp internal node of the circuitry described in the prior art. By transferring it over to the bit lines where it is an insignificant portion of the total capacitance, the sense amplifier output driver may be more quickly activated with a reduced load. Still further, since the circuit now requires only one of the two grounding transistors 136 or 138 to be turned on, the transfer time and the overall cycle is also considerably reduced.

Read head 23 shown in FIG. 6 is similar except that its set of read transistors 120b and 121b are respectively coupled to bit lines 44 and 45, their sources coupled to ground and their drains to the voltage source 125 through the load transistors 122b and 123b respectively, and to the differential amplifier 124b to output line 126b.

If the address sets P1, P2 and P3 are all different then all three sets of bit lines 40 and 41; and 42 and 43; and 44 and 45 have signals thereon. In this case read heads 21, 22 and 23 would each be operating in its normal mode, i.e., head 21 would be reading the signals on bit lines 40 and 41, head 22 would be reading the information on bit lines 42 and 43, and head 23 would be reading the information on bit lines 44 and 45.

In head 23 only the signals on the bit lines 44 and 45 would be detected since only devices 120b and 121b are directly connected then and thus can be turned on.

Thus, each read head is prevented from reading more than one set of bit lines.

When addresses P1 and P3 are identical a comparison would be made in comparator 16 causing line 66 to be positive and line 109a, the output of the clocked buffer 16, to be negative. When line 66 goes positive not only is the address decoder 51 shut off, shutting off word line 48 and bit lined devices 38 and 39, but the output line 109a of the clock buffer circuit goes negative pulling down the gates of the inhibit devices 135a and 139a turning off these devices and grounding the bit lines 45 of the third bit line pairs 44 and 45 in exactly the same manner as described above with respect to FIG. 5. Because of this, the bit lines 44 and 45 are made identical to the lines 40 and 41 and the read head 23 reads the same information as does read head 21.

Similarly, when addresses P2 and P3 are comparable the bit lines 44 and 45 are again modified through either 136b or 138b in exactly the same way as above described so that the bit lines 44 and 45 are caused to have the same information thereon as has bit lines 42 and 43.

If all three address signal sets are identical then all inhibit and transfer circuits are affected transferring the information on bit lines 40 and 41 to bit lines 42 and 43 and 44 and 45. In such a case where all address sets are the same all the read heads 21, 22 and 23 would all be reading the same information.

It should, of course, be obvious to one skilled in the art that although the preferred embodiment has been described as having differential bit line pairs that a single ended bit line arrangement could be readily used and that adaptation in the read heads and inhibit and transfer circuits would be made to accommodate such single ended bit line arrays can be readily accomplished.

It should also be noted that although a three port system has been described that anyone skilled in the art can now readily extend this invention to any system in excess of three ports.

Thus, there has been described a technique for accommodating multiple reads in multi-port register arrays which greatly reduces array size and improves performance. Basically the technique as described has been found to show a substantial area decrease in circuitry required and improved reliability of the circuitry.

While the invention has been particularly described with reference to the preferred embodiments thereof, it will be understood by those skilled in the art that changes in form and details can be made in the foregoing preferred embodiments without departing from the spirit and scope of the invention.

What is claimed is:

1. In a memory array having cells each of which is separately addressable from a plurality of write lines and is readable by a plurality of sets of low to high order bit lines, comprising:

a memory cell array, a set of low to high order word decoders coupled to each cell of the array, a set of low to high order read heads coupled to each cell of the array, the lowest order read head being coupled to the cell via the lowest order bit lines and the higher read heads being respectively coupled to the cell, via respective higher order bit lines, said read heads being equal in number to the number of said word decoders, at least one inhibit and transfer circuit coupled to each of said higher order read heads, address comparison means coupled to said higher order word decoders and said higher order read heads, each of said inhibit and transfer circuit comprising a pair of bit activated transistors having their control electrodes respectively coupled to the low order bit lines, a pair of grounding transistors each being coupled between a respective high order bit line and ground, and switching transistors coupled in parallel with the bit line activated transistors and respectively coupled to the control electrode of the grounding transistors to selectively control one of the grounding transistors and transfer the state of a lower order bit line to a higher order bit line.

2. In a memory array having cells each of which is separately addressable from a plurality of write lines and is readable by a plurality of sets of low to high order bit lines, comprising:

a memory cell array, a set of low to high order word decoders coupled to each cell of the array, a set of low to high order read heads coupled to each cell of the array, via said plurality of bit lines, said higher order read heads being equal in number to the number of higher order word decoders, at least one inhibit and transfer circuit coupled to each of said higher order read heads, the number of said inhibit and transfer circuits coupled to the higher order read heads being one less than the order of the bit lines to which the read head is coupled, address comparison means coupled to said higher order word decoders and said higher order read heads, each of said inhibit and transfer circuit comprising a pair of bit activated transistors having their control electrodes respectively coupled to the low order bit lines, a pair of grounding transistors each being coupled between a respective high order bit line and ground, and a switching transistor coupled in parallel with the bit line activated transistors and to the control electrode of the grounding transistors to selectively control one of the grounding transistors and transfer the state of a lower order bit line to a higher order bit line.

3. The array of claim 1 wherein each of said inhibit and transfer circuits are coupled to a clocked buffer circuit driven by said comparison means.

4. The memory array of claim 1 wherein said address comparison means, in the event of a compare between said addresses, provides a signal to said higher order word decoders to disable selected ones of said higher order word decoders, and to said clocked buffer circuits to switch said inhibit and transfer circuits to inhibit selected ones of said higher order read heads from reading the higher order bit lines of the set of simultaneously addressed bit lines from the cell while simultaneously transferring the information of the lowest order of said set of simultaneously addressed bit lines to the highest order of simultaneously addressed bit lines.

5. In a memory array which is separately addressable from a plurality of write lines and readable by a plurality of bit lines comprising:

a memory cell array, each cell being coupled to sets of low to high order bit lines, a plurality of sets of low to high order decoders, coupled to the cells of the array, a plurality of sets of low to high order read heads equal in number to the number of word decoders coupled to the cells of the array, and having a plurality of output read lines equal to the number of said word decoders, each of said high order read heads being connected to its respective set of bit lines and coupled to all sets of lower order bit lines, at least one inhibit and transfer circuit coupled to each of the higher order read heads, a plurality of comparator means for comparing the address inputs to the word decoders, said comparator means being coupled to the word decoders and the inhibit and transfer circuits and in the event of a compare disabling selected ones of word decoders, and activating selected ones of the inhibit and transfer circuits, said inhibit and transfer circuits setting the higher order of bit lines to the same state as the lowest order bit line set having the same address as the higher order bit lines to which the read head is connected.

6. An inhibit and transfer circuit comprising:

a pair of bit activated transistors having their control electrodes coupled to a first source of bit signals, a pair of grounding transistors each being coupled between a second source of bit signals and ground, and switching transistors coupled in parallel with the bit activated transistors and respectively coupled to the control electrodes of the grounding transistors, to selectively control one of the grounding transistors to selectively force the said second source of bit signals to be identical to the first source of signals.

* * * * *